United States Patent
Katti et al.

(10) Patent No.: US 7,170,123 B2
(45) Date of Patent: *Jan. 30, 2007

(54) ANTIFERROMAGNETICALLY STABILIZED PSEUDO SPIN VALVE FOR MEMORY APPLICATIONS

(75) Inventors: Romney R. Katti, N. Maple Grove, MN (US); Joel A. Drewes, Boise, ID (US); Timothy J. Vogt, Elk River, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/146,431

(22) Filed: Jun. 7, 2005

(65) Prior Publication Data

US 2006/0018150 A1    Jan. 26, 2006

Related U.S. Application Data

(60) Division of application No. 10/760,127, filed on Jan. 16, 2004, now Pat. No. 6,903,399, which is a continuation of application No. 10/193,458, filed on Jul. 10, 2002, now Pat. No. 6,707,084.

(60) Provisional application No. 60/354,623, filed on Feb. 6, 2002.

(51) Int. Cl.
   *H01L 29/76* (2006.01)

(52) U.S. Cl. .................. 257/295; 257/296; 365/158
(58) Field of Classification Search ........... 257/295, 257/9, 296; 365/158

See application file for complete search history.

(56) References Cited

U.S. PATENT DOCUMENTS

| | | | |
|---|---|---|---|
| 5,477,482 A | 12/1995 | Prinz | |
| 5,541,868 A | 7/1996 | Prinz | |
| 5,627,703 A | 5/1997 | Smith | |
| 6,134,138 A * | 10/2000 | Lu et al. ............... | 365/158 |
| 6,215,695 B1 | 4/2001 | Ikeda | |
| 6,326,637 B1 | 12/2001 | Parkin et al. | |
| 6,452,764 B1 | 9/2002 | Abraham et al. | |
| 6,707,084 B2 | 3/2004 | Katti et al. | |
| 6,903,399 B2 * | 6/2005 | Katti et al. ............... | 257/295 |
| 2001/0030839 A1 | 10/2001 | Zhong et al. | |
| 2002/0018323 A1 | 2/2002 | Li et al. | |
| 2003/0007398 A1 | 1/2003 | Daughton | |
| 2005/0237790 A1 | 10/2005 | Katti et al. | |

OTHER PUBLICATIONS

Daughton, James M., "Advanced MRAM Concepts" *Article from NVE Corporation*, Feb. 7, 2001, pp. 1-6.

(Continued)

*Primary Examiner*—Andy Huynh
*Assistant Examiner*—Thinh T Nguyen
(74) *Attorney, Agent, or Firm*—Knobbe Martens Olson & Bear LLP

(57) ABSTRACT

The invention relates to improving the switching reliability of a magnetic memory cell in a magnetic random access memory (MRAM). Embodiments of the invention add an antiferromagnet to a magnetic memory cell. An antiferromagnetic layer can be formed adjacent to a soft layer in the MRAM on a side of the soft layer that is opposite to a hard layer of the MRAM. One embodiment further includes an additional interlayer of non-antiferromagnetic material between the antiferromagnetic layer and the soft layer.

9 Claims, 10 Drawing Sheets

OTHER PUBLICATIONS

"Magnetoelectronics" [online] [retrieved on Jan. 25, 2002] Retrieved from the Internet: <URL: www.ipm.virginia.edu/research/ PVD/Pubs/thesis7/chapter2.PDF> Chapter 2 pp. 7-34.

Everitt, et al., "Pseudo Spin Valve MRAM Cells with Sub-Micrometer Critical Dimension" IEEE Transaction on Magnetics, vol. 34, No. 4, (1998), pp. 1060-1062.

Lee, et al., "Separation of Contributions to Spin Valve Interlayer Exchange Coupling Field by Temperature Dependent Coupling Field Measurements" [online] 46th MMM Conference Seattle, Washington 2001 pp. 1-16 [retrieved on Jan. 25, 2002] Retrieved from the Internet: <URL:www.andrew.cmu.edu/~zlee/mmm.pdf>.

Shi, et al., "End Domain States and Magnetization Reversal in Submicron Magnetic Structures" IEEE Transactions on Magnetics, vol. 34, No. 4, Jul. 1998, pp. 997-999.

"Non-Volatile Memory (MRAM)" ANXXX [online] Honeywell <retrieved on Nov. 19, 2001> <URL: www.ssec.honeywell.com/avionics/h_gmr.pdf> pp. 1-4.

PCT International Search Report dated Jul. 29, 2003.

Inomata, K. "Present and Future of Magnetic RAM Technology" *IEICE Transactions on Electronics*, vol. E84-C, No. 6, (Jun. 2001), pp. 740-746.

\* cited by examiner

ANTIFERROMAGNETICALLY STABILIZED PSEUDO SPIN VALVE FOR MEMORY APPLICATIONS

RELATED APPLICATION

This application is a divisional application of U.S. application Ser. No. 10/760,127, filed Jan. 16, 2004, now U.S. Pat. No. 6,903,399, which is a continuation application of U.S. application Ser. No. 10/193,458, filed Jul. 10, 2002, now U.S. Pat. No. 6,707,084, which claims the benefit under 35 U.S.C. § 119(e) of U.S. Provisional Application No. 60/354,623, filed Feb. 6, 2002, the disclosures of which are hereby incorporated by reference in their entireties herein.

This application is also related to U.S. application Ser. No. 11/103,347, filed Apr. 11, 2005, the disclosure of which is hereby incorporated by reference in its entirety herein.

GOVERNMENT RIGHTS

This invention was made with Government support under Contract Number MDA972-98-C-0021 awarded by DARPA. The Government has certain rights in the invention.

BACKGROUND OF THE INVENTION

1. Field of the Invention

The invention generally relates to memory technology. In particular, the invention relates to non-volatile magnetic memory.

2. Description of the Related Art

Computers and other digital systems use memory to store programs and data. A common form of memory is random access memory (RAM). Many memory devices, such as dynamic random access memory (DRAM) devices and static random access memory (SRAM) devices are volatile memories. A volatile memory loses its data when power is removed. For example, when a conventional personal computer is powered off, the volatile memory is reloaded through a boot up process. In addition, certain volatile memories such as DRAM devices require periodic refresh cycles to retain their data even when power is continuously supplied.

In contrast to the potential loss of data encountered in volatile memory devices, nonvolatile memory devices retain data for long periods of time when power is removed. Examples of nonvolatile memory devices include read only memory (ROM), programmable read only memory (PROM), erasable PROM (EPROM), electrically erasable PROM (EEPROM), flash memory, and the like. Disadvantageously, conventional nonvolatile memories are relatively large, slow, and expensive. Further, conventional nonvolatile memories are relatively limited in write cycle capability and typically can only be programmed to store data about 10,000 times in a particular memory location. This prevents a conventional non-volatile memory device, such as a flash memory device, from being used as general purpose memory.

An alternative memory device is known as magnetoresistive random access memory (MRAM). An MRAM device uses magnetic orientations to retain data in its memory cells. Advantageously, MRAM devices are relatively fast, are nonvolatile, consume relatively little power, and do not suffer from a write cycle limitation. A pseudo spin valve (PSV) MRAM device uses an asymmetric sandwich of the ferromagnetic layers and metallic layer as a memory cell, and the ferromagnetic layers do not switch at the same time.

The asymmetric sandwich of a PSV MRAM includes a "hard layer" that stores data and a "soft layer" that switches or flips to allow data to be stored and read in the hard layer. When operating as intended, the soft layer switches before the hard layer. The earlier switching of the soft layer advantageously inhibits switching of the hard layer, which then results in a higher write threshold for a PSV MRAM than for a spin valve MRAM.

One problem with conventional PSV MRAM devices is that the magnetization of the soft layer is not well controlled. A soft layer that fails to switch at a relatively low applied magnetic field can result in a PSV MRAM device that undesirably behaves as a spin valve rather than a PSV. This reduces the write threshold and can result in corrupting the stored data during a read operation. To protect PSV MRAM devices from data corruption, the fields generated during read operations are maintained to relatively low levels, which results in relatively low repeatability and cyclability of writing to and reading from memory cells.

SUMMARY OF THE INVENTION

Embodiments of the invention solve these and other problems by stabilizing the soft layer of a pseudo spin valve (PSV). Embodiments of the invention include a layer of antiferromagnetic material (AFM), which stabilizes the magnetization of the thin layer. The stabilization of the soft layer of the PSV provides PSV MRAM devices with relatively good repeatability and cyclability.

Embodiments of the invention include an antiferromagnet in a magnetic memory cell. An antiferromagnetic layer can be formed adjacent to a soft layer in an MRAM on a side of the soft layer that is opposite to a hard layer of the MRAM. One arrangement further includes an additional interlayer of non-antiferromagnetic material between the antiferromagnetic layer and the soft layer.

The antiferromagnetic material (AFM) is formed adjacent to or near to the soft layer of the PSV. The layer of AFM should be formed on a side of the soft layer that is opposite to a side with a hard layer of the PSV. In addition, an amount of coupling between the soft layer and the AFM layer should be sufficiently low enough to allow the soft layer to switch at a lower magnetic field than the hard layer, thereby maintaining a relatively wide spread between the strength of a magnetic field used in a read operation and the strength of a magnetic field used in a write operation.

One embodiment of the invention includes an antiferromagnetically stabilized pseudo spin valve (ASPSV) in a magnetic random access memory (MRAM). The ASPSV includes a hard layer of ferromagnetic material, a soft layer of ferromagnetic material, a spacer layer of non-ferromagnetic material disposed between the hard layer and the soft layer; and an antiferromagnetic layer disposed adjacent to the soft layer. The antiferromagnetic layer should also be disposed on a side of the soft layer that is opposite to the hard layer. The antiferromagnetic layer can be formed from an alloy of manganese, such as from ferro manganese (FeMn).

Another embodiment of the invention includes an antiferromagnetically stabilized pseudo spin valve (ASPSV) in a magnetic random access memory (MRAM) with an AFM interlayer. The ASPSV includes a hard layer of ferromagnetic material adapted to store data in a magnetic orientation, a soft layer of ferromagnetic material adapted to switch orientation to allow data to be read from the hard layer, a spacer layer of non-ferromagnetic material disposed between the hard layer and the soft layer, an antiferromagnetic layer disposed on a side of the soft layer that is opposite to the hard layer, and the AFM interlayer. The AFM interlayer is disposed between the soft layer and the antiferromagnetic layer. The AFM interlayer can be formed from a variety of materials, but should not be formed from an antiferromagnetic material. Suitable materials for the AFM interlayer include iridium (Ir), copper (Cu), ruthenium (Ru), chromium (Cr), and aluminum (Al). The AFM interlayer can be relatively thin, such as about a monolayer in thickness.

Another embodiment of the invention includes a method of stabilizing a pseudo spin valve (PSV). The method includes providing a magnetoresistive sandwich that includes a soft layer and a hard layer, and forming an antiferromagnetic layer on the magnetoresistive sandwich near to the soft layer and on a side of the soft layer that is opposite to the hard layer. The antiferromagnetic layer can be formed adjacent to the soft layer, or a AFM interlayer can also be formed between the soft layer and the antiferromagnetic layer.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

DETAILED DESCRIPTION OF THE PREFERRED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

A magnetoresistive random access memory (MRAM) stores data in magnetic states of its memory cells. The electrical resistance of the cell varies depending on the stored magnetic state of the cell. The stored state of the cell is detected by sensing the difference in resistance.

Figure 1:
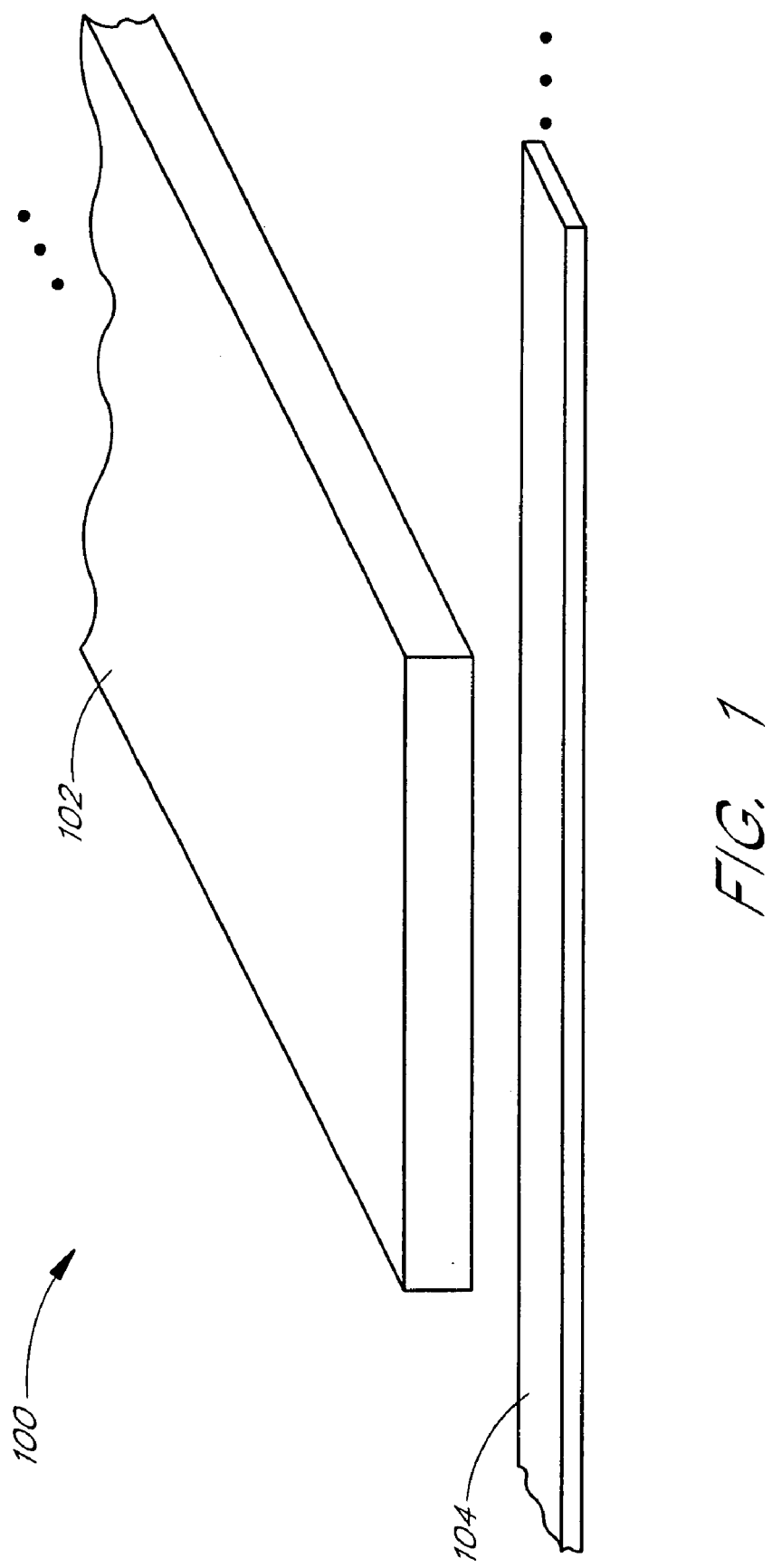
FIG. 1 is a perspective view illustrating a giant magnetoresistance (GMR) cell in a spin valve mode.

FIG. 1 is a perspective view illustrating a GMR cell 100 in a spin valve mode. The GMR cell 100 includes a word line 102 and a bit line 104. In a GMR cell, the bit line 104 is also known as a sense line. The bit line 104 contains magnetic layers. Data is stored in a cell body portion of the bit line 104 by simultaneously applying current through the word line 102 and the bit line 104. The direction of the currents in the word line 102 and in the bit line 104 (and the consequent magnetic field applied) determines the polarization of the magnetic orientation that stores the logical state of the data. For example, the applied field component from the bit line current can be clockwise around the bit line 104 for a first current direction, and counterclockwise around the bit line 104 for a second current direction, and similarly for the word line 102. The vector sum of the applied magnetic fields from the two (or more) conductive lines determines the magnetic state of the cell.

To read data from the GMR cell 100, currents are again applied to the word line 102 and the bit line 104 corresponding to the GMR cell 100. The resistance encountered by the current applied to the bit line 104 varies depending on the logical state stored in the magnetic layers. A cell with a larger resistance exhibits a larger voltage drop with the current than a cell with a smaller resistance.

Figure 2:
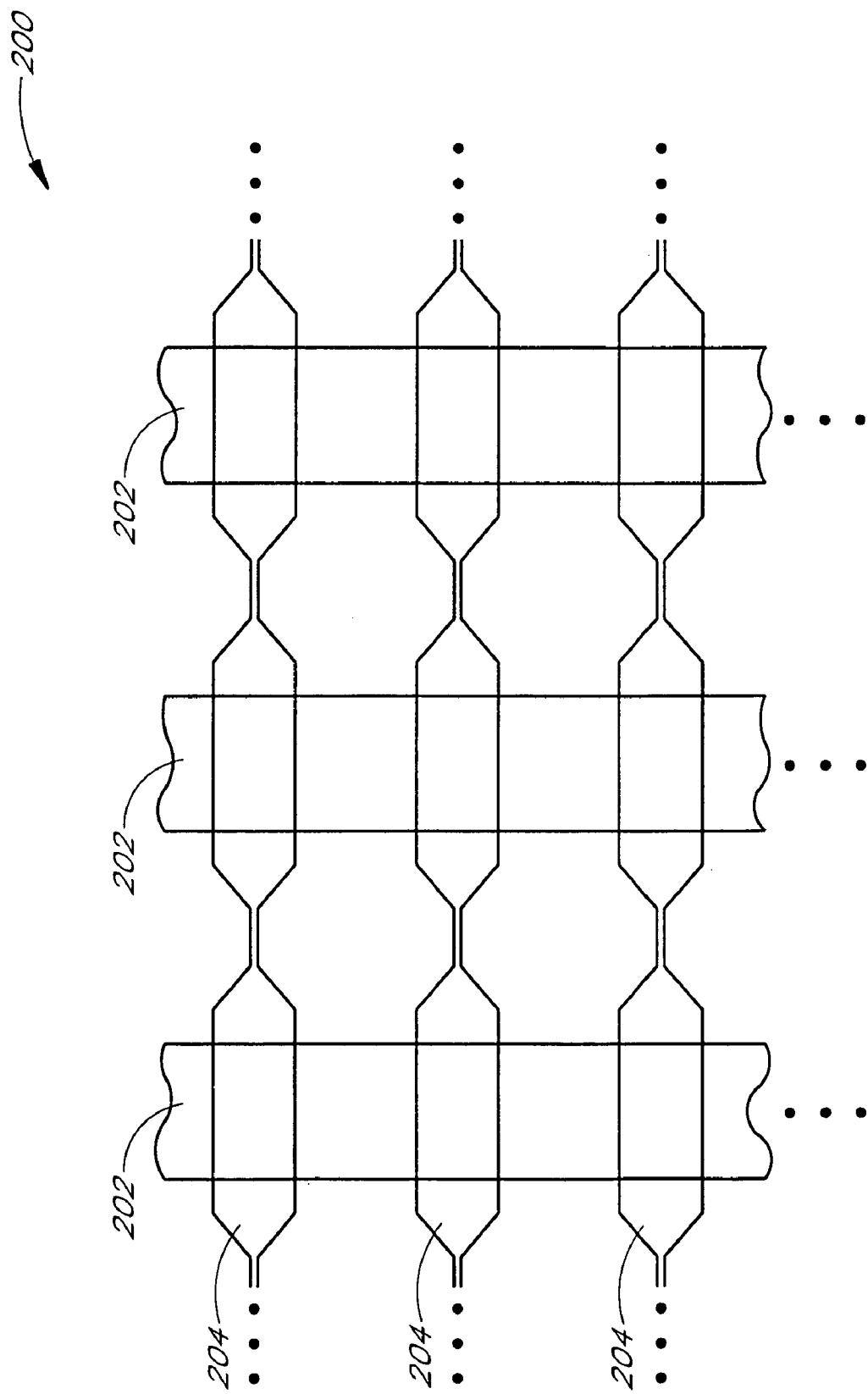
FIG. 2 is a schematic top-down view illustrating an array of GMR cells.

FIG. 2 is a schematic top-down view illustrating an array 200 of GMR cells. A plurality of cells are arranged into the array 200 in a memory device. The array 200 of cells includes a plurality of word lines 202 and a plurality of bit lines 204. An individual cell within the array 200 is selected by applying current through the corresponding word line and the corresponding bit line. Data is not stored or read in a cell where current flows through only one of the cell's word line or bit line.

Figure 3:
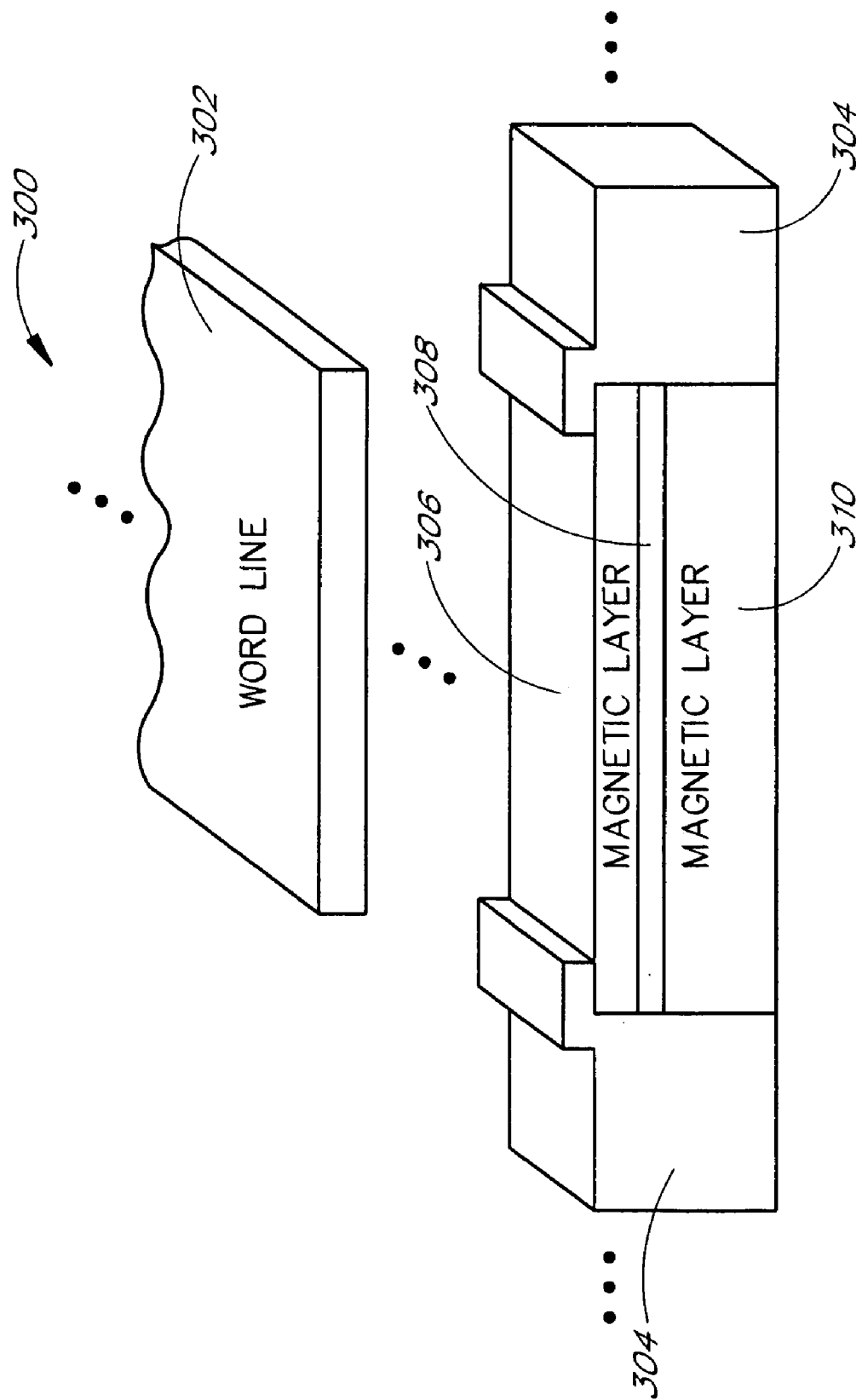
FIG. 3 illustrates a GMR cell in a pseudo spin valve (PSV) mode.

FIG. 3 illustrates a GMR cell 300 in a pseudo spin valve (PSV) mode. The GMR cell 300 includes a word line 302 and a bit line 304. The bit line 304 of the GMR cell 300, which is also known as a sense line, further includes a GMR stack including a first magnetic layer 306, a conductive layer 308, and a second magnetic layer 310. The first magnetic layer 306 and the second magnetic layer 310 are mismatched so that the first magnetic layer 306 is magnetically "softer" than the second magnetic layer 310. The mismatch in magnetic properties can be obtained by making the first magnetic layer 306 relatively thin as compared to the second magnetic layer 310; by selecting a relatively soft magnetic material for the first magnetic layer 306 and a relatively hard magnetic material for the second magnetic layer 310; or both. Other terms used to describe a "hard layer" include "pinned layer" and "fixed layer." However, it will be understood by one of ordinary skill in the art that the stored magnetic orientation in a hard layer can be varied in accordance with the logical state of the stored data. Other terms used to describe a "soft layer" include "variable layer" and "flipped layer." It will be understood by one of ordinary skill in the art that the GMR stack can further include multiple layers of ferromagnetic materials and spacers.

The GMR cell 300 stores data as a magnetic orientation in the second magnetic layer 310. A relatively high magnetic field is required to switch the magnetization of the second magnetic layer 310 so that the magnetization remains fixed in operation. The magnetic state of the GMR cell 300 is switched by switching the magnetization of the first magnetic layer 306, which can be switched with a relatively low magnetic field generated by applying current to the corresponding word line 302 and the corresponding bit line 304.

The resulting magnetization of the first magnetic layer 306 is either parallel or anti-parallel to the magnetization of the second magnetic layer 310. When the magnetization in the first magnetic layer 306 is parallel with the magnetization of the second magnetic layer 310, the electrical resistance of the GMR cell 300 is lower than when the magnetization is relatively is anti-parallel. Current in the word line 302 and/or the bit line 304 can be switched in both directions to correspondingly switch the magnetization of the first magnetic layer 306, i.e., the soft magnetic layer, between parallel and anti-parallel states. The difference in electrical resistance of the bit line 304 is then sensed, thereby allowing the stored logical state of the GMR cell 300 to be retrieved.

Figure 4:
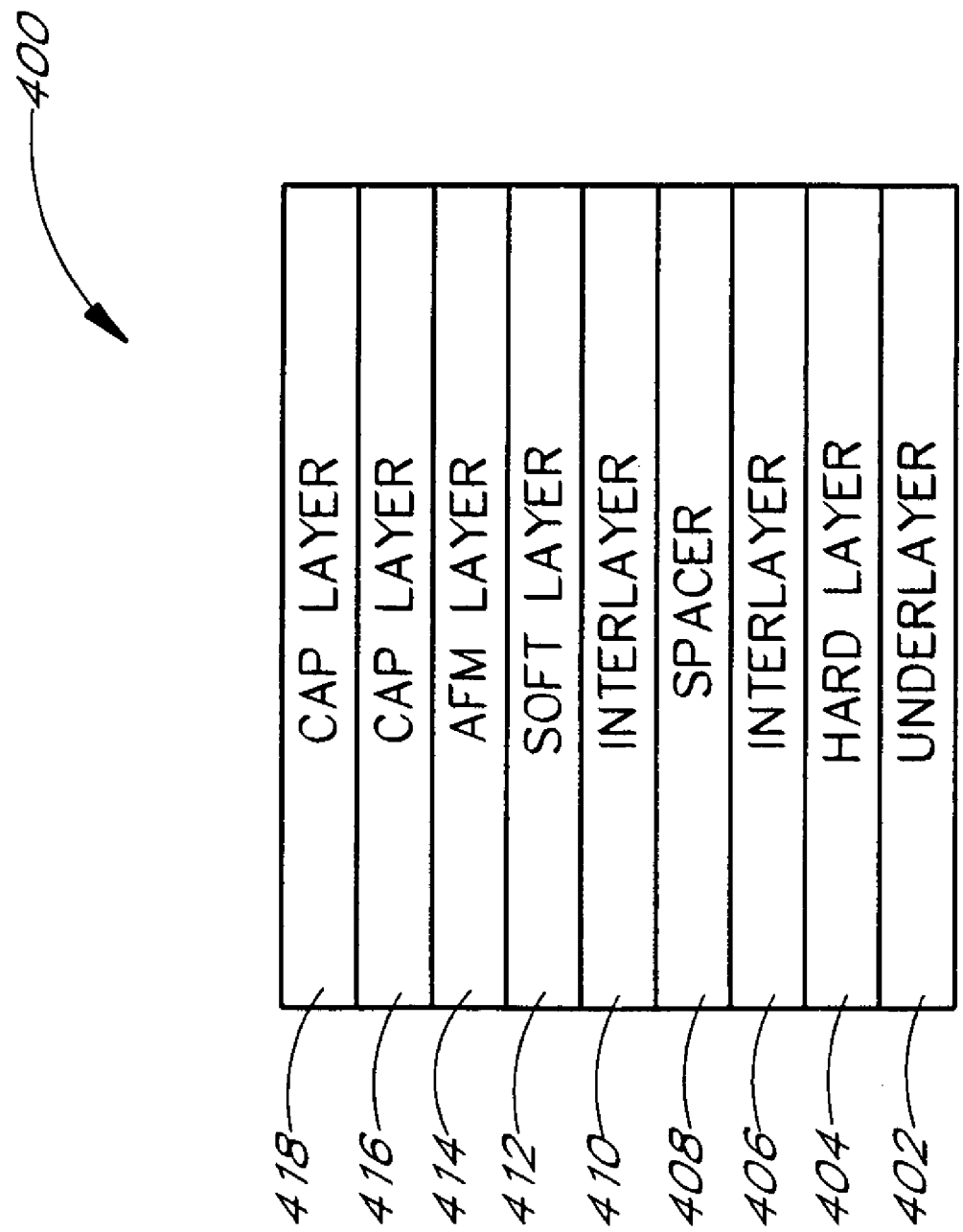
FIG. 4 is a cross-sectional view of a magnetoresistive stack for an antiferromagnetically stabilized pseudo spin valve (ASPSV) according to an embodiment of the invention.

FIG. 4 illustrates a cross-sectional view of a magnetoresistive stack 400 for an antiferromagnetically stabilized PSV cell according to an embodiment of the invention. Test results for the magnetoresistive stack 400 will be described later in connection with FIGS. 6 through 10. Although the magnetoresistive stack 400 is shown with barrier or cap layers and with extra interlayers, it will be understood by one of ordinary skill in the art that embodiments of the invention include those without all the layers described herein. For example, barrier layers can be selected depending on the fabrication processes used and on the composition of the substrate assembly, insulating layers, conductors, and the magnetoresistive materials themselves.

The illustrated magnetoresistive stack 400 includes an underlayer 402, a hard layer 404, a first interlayer 406, a spacer layer 408, a second interlayer 410, a soft layer 412, an antiferromagnetic (AFM) layer 414, a first cap layer 416, and a second cap layer 418. The underlayer 402 or seeding layer provides adhesion between an underlying layer in the substrate and the hard layer 404 by providing texture to the stack. The underlayer 402 can also protect against the undesired diffusion of atoms from the hard layer 404 to an underlying layer, such as a silicon substrate. A variety of materials can be used for the underlayer 402. In one embodiment, the underlayer 402 is formed from tantalum (Ta). Other materials that can be used for the underlayer 402 include titanium (Ti), ruthenium (Ru), nickel iron chromium (NiFeCr), and tantalum nitride (TaN). The underlayer 402 can be formed to a broad range of thicknesses. In one embodiment, the underlayer 402 is within a range of about 10 Angstroms (Å) to about 100 Å thick. Various processing techniques, such as physical vapor deposition (PVD) techniques, chemical vapor deposition (CVD) techniques, and the like, can be used to form the various layers described herein.

The hard layer 404 (or thick layer) stores the data for the antiferromagnetically stabilized PSV cell. A relatively large word current, which generates a relatively large magnetic field, switches the orientation of the magnetic moment stored in the hard layer 404 to store data. The hard layer 404 can be made from a variety of ferromagnetic materials, such as permalloy ($Ni_{80}Fe_{20}$), cobalt-iron ($Co_{90}Fe_{10}$), and the like. In one embodiment, the hard layer 404 is within a range of about 20 Å to about 100 Å thick.

The first interlayer 406 is optional. The first interlayer 406 can be included in the magnetoresistive stack 400 to enhance the signal, i.e., the change in resistance, from the magnetoresistive stack 400. In one embodiment, where the hard layer 404 is formed from permalloy, the first interlayer 406 is formed from cobalt (Co) or from an alloy that includes cobalt, such as $Co_{90}Fe_{10}$, $Co_{80}Fe_{20}$, and the like. In one example, the thickness of the first interlayer 406 is within a range of about 2 Å to about 15 Å.

The spacer layer 408 is a nonmagnetic layer that separates the magnetic layers. The spacer layer 408 can be formed from a broad variety of non-ferromagnetic materials. A broad variety of materials can be used to form the spacer layer 408. In one embodiment, the spacer layer 408 is copper (Cu). Alloys of copper are also suitable materials, such as copper silver (CuAg), copper gold silver (CuAuAg), and the like. In one example, the thickness of the spacer layer 408 is within a range of about 18 Å to about 45 Å.

The second interlayer 410 is optional. The second interlayer 410 can be included to enhance the signal from the magnetoresistive stack 400. In one embodiment, where the soft layer 412 is formed from permalloy, the second interlayer 410 is formed from cobalt (Co) or from an alloy that includes cobalt, such as $Co_{90}Fe_{10}$, $Co_{80}Fe_{20}$, and the like. The thickness of the second interlayer 410 can correspond to a range of about 2 Å to about 15 Å.

The magnetic moment of the soft layer 412 (or thin layer) can be switched or flipped with relatively low word currents and relatively low magnetic fields. When the magnetic moment of the soft layer 412 and the magnetic moment of the hard layer 404 are parallel, the resistance of the PSV cell is relatively low. When the magnetic moment of the soft layer 412 and the magnetic moment of the hard layer 404 are anti-parallel, the resistance of the PSV cell is relatively high. The soft layer 412 can be made from a variety of materials, such as permalloy ($Ni_{80}Fe_{20}$), cobalt-iron ($Co_{90}Fe_{10}$), and the like. In one embodiment, the thickness of the soft layer 412 is about 20% to about 80% thinner than the thickness of the hard layer 404.

The AFM layer 414 is a layer of an antiferromagnetic material. An antiferromagnetic material produces anti-parallel alignments of electron spins in response to an applied magnetic field and has no net magnetic moment. The AFM layer 414 assists to control the magnetization of the soft layer 412 such that the soft layer 412 more consistently switches magnetic moments at a relatively low applied magnetic field, thereby allowing the antiferromagnetically stabilized PSV MRAM to maintain relatively safe and robust high write thresholds, i.e., improves the switching reliability of the thin layer. Electrically, the AFM layer 414 is in parallel with the soft layer 412. This can disturb the detection of the variable resistance from the soft layer 412, which is used to detect the memory state stored in the hard layer 404. To reduce the disturbance to the detection of the memory state, the AFM layer 414 should be formed from a material with a relatively high resistivity and/or should be relatively thin.

The AFM layer 414 is preferably formed from an alloy of manganese, such as an antiferromagnetic alloy of ferro manganese (FeMn) including $Fe_{50}Mn_{50}$. Other suitable alloys of manganese include iridium manganese ($Ir_{20}Mn_{80}$), platinum manganese (PtMn), and nickel manganese ($Ni_{45}Mn_{55}$). The AFM layer 414 can also be formed from an oxide of a ferromagnetic material, such as nickel oxide (NiO) and nickel cobalt oxide (NiCoO), and the like, but such oxides can be relatively unstable over temperature. The AFM layer 414 should be disposed on a side of the soft layer 412 that is opposite to the hard layer 404. In addition, the AFM layer 414 should not be so thick that pinning of the soft layer results, which detrimentally results in spin valve characteristics from the pseudo spin valve. In one embodiment, the thickness of the AFM layer 414 is within a range of about 10 Å to about 70 Å. The thickness of the AFM layer 414 can vary according to the thickness and the switching fields of the hard layer 404 and the soft layer 412.

The first cap layer 416 (or protective cap layer) provides adhesion to the AFM layer 414 and provides a barrier against the undesired diffusion of atoms from the AFM layer 414 to other layers in the substrate assembly. In one embodiment, the first cap layer 416 is formed from tantalum (Ta). Other materials that can be used for the first cap layer 416 include copper (Cu), titanium nitride (TaN), and the like. The thickness of the first cap layer 416 can vary in a broad range. In one embodiment, the thickness of the first cap layer 416 is within about 50 Å to about 500 Å thick.

The second cap layer 418 (or diffusion barrier cap layer) is an optional layer. For some etching processes, the addition of the second cap layer 418 provides a relatively good stopping layer. In one embodiment, the second cap layer 418 is a layer of chromium silicon (CrSi). Other materials that can be used for the second cap layer 418 include copper (Cu), tantalum (Ta), titanium nitride (TiN), and the like. In one embodiment, the thickness of the second cap layer 418 is within a range of about 100 Å to about 200 Å thick, but it will be understood by one of ordinary skill in the art that the thickness can vary within a broad range.

Figure 5:
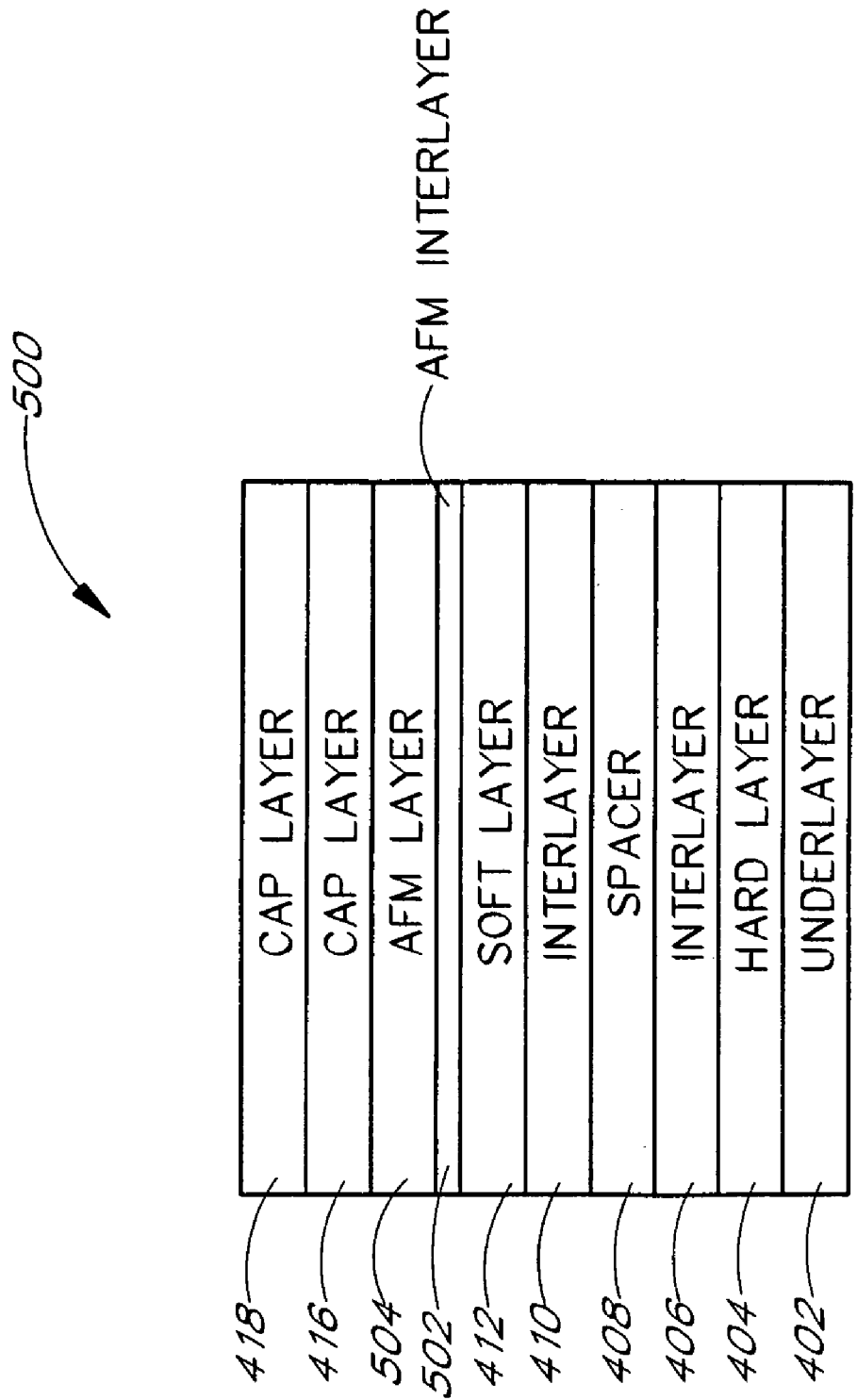
FIG. 5 is a cross-sectional view of a magnetoresistive stack for an ASPSV according to another embodiment of the invention.

FIG. 5 illustrates a cross-sectional view of a magnetoresistive stack 500 for an antiferromagnetically stabilized pseudo spin valve according to another embodiment of the invention. The magnetoresistive stack 500 includes the underlayer 402, the hard layer 404, the first interlayer 406, the spacer layer 408, the second interlayer 410, the soft layer 412, the first cap layer 416, and the second cap layer 418 described earlier in connection with FIG. 4. In addition, the magnetoresistive stack 500 includes an AFM interlayer 502 and an AFM layer 504, which are disposed between the soft layer 412 and the first cap layer 416. Unlike the AFM layer 504, the AFM interlayer 502 is not formed from an antiferromagnetic material. In one embodiment, the AFM interlayer 502 is formed from a relatively thin layer of iridium (Ir). Other suitable materials for the AFM interlayer 502 include copper (Cu), ruthenium (Ru), chromium (Cr), aluminum (Al), and others.

The AFM layer 504 can be formed from an antiferromagnetic material, such as ferro manganese (FeMn). Other materials that are suitable for the AFM layer 504 include various other alloys of manganese as well as various oxides as described earlier in connection with FIG. 4. The AFM layer 504 should be disposed on a side of the soft layer 412 that is opposite to the hard layer 404. In one embodiment, the thickness of the AFM layer 504 is within a range of about 70 Å to about 200 Å. The increase in thickness of the AFM layer 504 (versus the AFM layer 414) increases the exchange coupling such that the ferromagnetic film on the other side of the AFM interlayer 502 is affected.

The AFM interlayer 502 is disposed between the AFM layer 504 and the soft layer 412. In one example, the AFM interlayer 502 has a thickness within a range of about 1 Å to about 5 Å. Preferably, the AFM interlayer 502 is about a monolayer in thickness, i.e., about one atomic layer thick. In one embodiment, the AFM interlayer 502 is less than a monolayer in thickness. The AFM interlayer 502 serves as a spacer layer between the AFM layer 504 and the soft layer 412.

Advantageously, the AFM interlayer 502 can be used to adjust or to select the amount of coupling between the AFM layer 504 and the soft layer 412 by reducing the coupling strength between the AFM layer 504 and the hard layer 404 and/or the soft layer 412. However, the AFM interlayer 502 should not be so thick that coupling between the AFM layer 504 and the soft layer 412 is lost. Further advantageously, the AFM interlayer 502 can also enhance the uniformity of the coupling between the AFM interlayer 502 and the soft layer 412.

FIGS. 6–10 are R-H test plots of an example of the antiferromagnetically stabilized pseudo spin valve (ASPSV) described earlier in connection with FIG. 4. It will be understood by one of ordinary skill in the art that the test results will vary substantially in accordance with a selection of materials, layer thicknesses, and cell geometries. In FIGS. 6–10, a vertical axis, i.e., the y-axis, corresponds to resistance and has units of ohms as indicated to the far right of FIGS. 6–10. To the far left of FIGS. 6–10, the resistance is also indicated as a percentage change based on the minimum resistance shown for the respective figure. A horizontal axis, i.e., the x-axis, indicates magnetic field strength and has units of oersteds (Oe).

Figure 6:
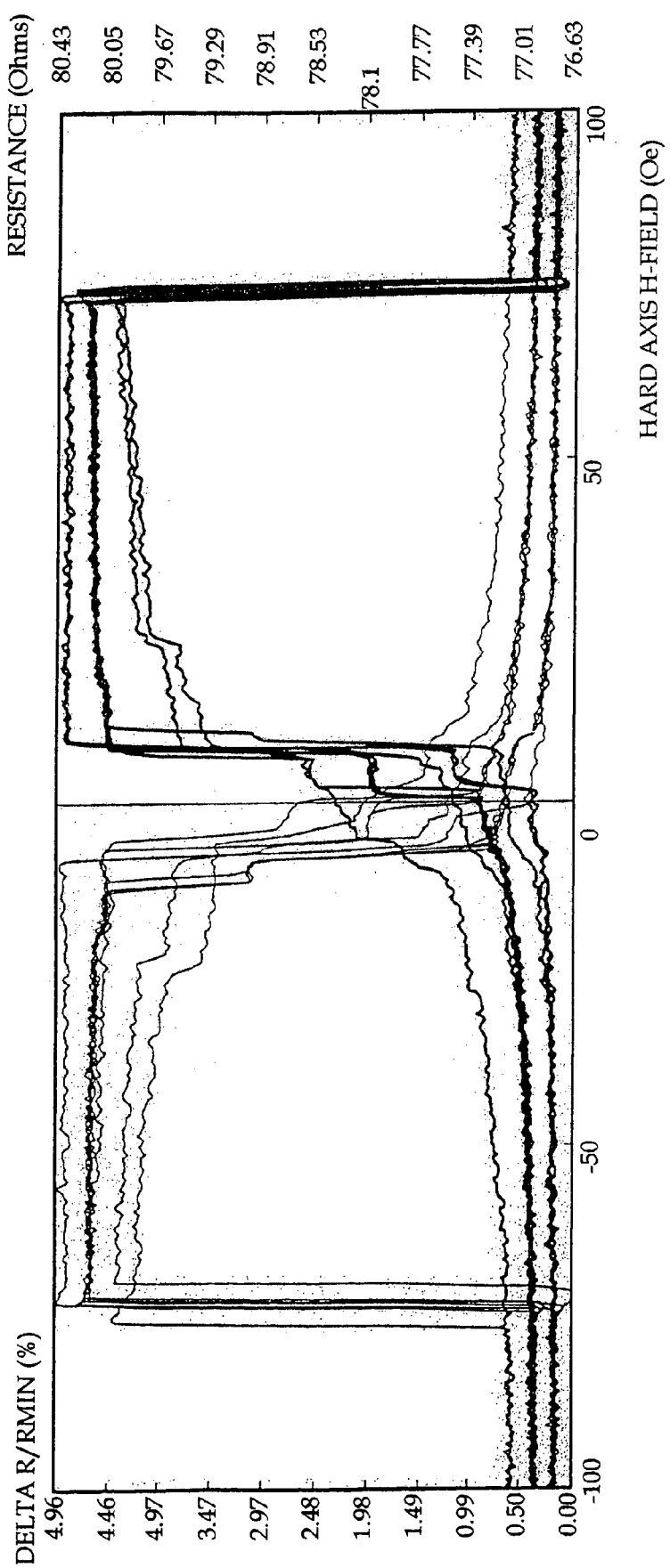
FIG. 6 is an R-H plot of an ASPSV illustrating thresholds for writing data when the ASPSV is not selected.

FIG. 6 is an R-H plot taken from an example of the magnetoresistive stack 400 described earlier in connection with FIG. 4. The R-H plot of FIG. 6 illustrates the resistance of the magnetoresistive stack 400 versus a first magnetic field ("H-field") that is swept along one axis of the magnetoresistive stack 400. The applied first H-field is represented along a horizontal or x-axis of FIG. 6. No other H-field is applied to the magnetoresistive stack 400, so that the data in FIG. 6 is representative of the conditions that the magnetoresistive stack 400 would encounter in operation when the corresponding ASPSV cell is not selected. Bold data lines correspond to data taken with the first H-field swept in one direction, termed a forward direction; and thin data lines correspond to data taken with the first H-field swept in the opposite direction, termed a reverse direction.

As illustrated in FIG. 6, the magnetoresistive stack 400 advantageously does not switch until the magnitude of the first H-field has reached about 75–80 Oe, which is relatively high. This indicates that ASPSV cells that are not selected can tolerate a relatively high H-field without losing data.

Figure 7:
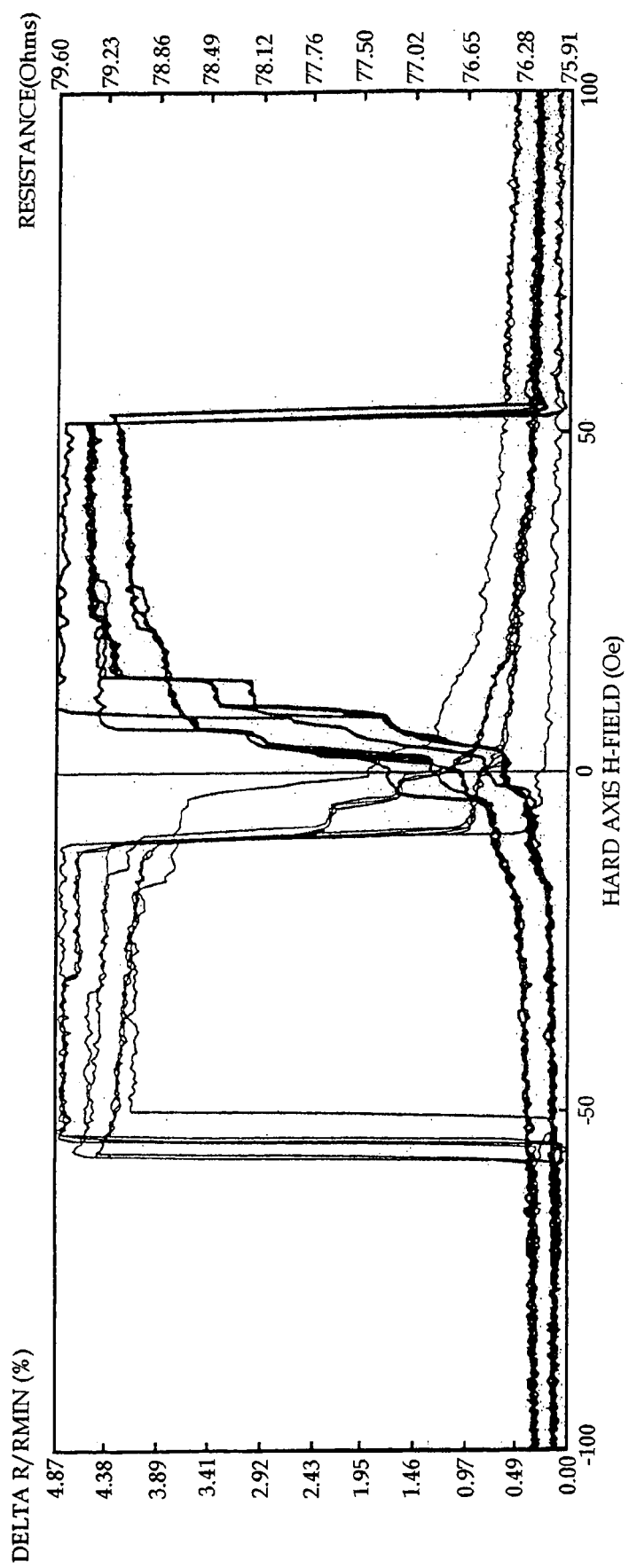
FIG. 7 is an R-H plot of an ASPSV for a write operation, where the ASPSV is subjected to the presence of a digital field.

FIG. 7 is an R-H plot of the example of the magnetoresistive stack 400 described earlier in connection with FIGS. 4 and 6. The R-H plot of FIG. 7 again illustrates the resistance of the magnetoresistive stack 400 versus the first H-field. However, a second H-field that is approximately orthogonal to the first H-field is also applied to the magnetoresistive stack 400 for the data shown in FIG. 7. The second H-field approximates the H-field that would be generated by a current flowing through a conductor that is used to select the ASPSV cell with the magnetoresistive stack 400 from an array of ASPSV cells in an MRAM. This second H-field is sometimes referred to in the art as a "digital" field.

The horizontal or x-axis represents the first H-field that is swept along one axis of the magnetoresistive stack 400. When the magnetoresistive stack 400 is subjected to the second H-field, the magnetoresistive stack 400 switches for a write when the magnitude of the first H-field is about 53 Oe. This is lower than the approximately 75–80 Oe described in connection with FIG. 6, and indicates that a write to a selected ASPSV cell can occur without undesirably overwriting the contents of an ASPSV cell that was not selected.

Figure 8:
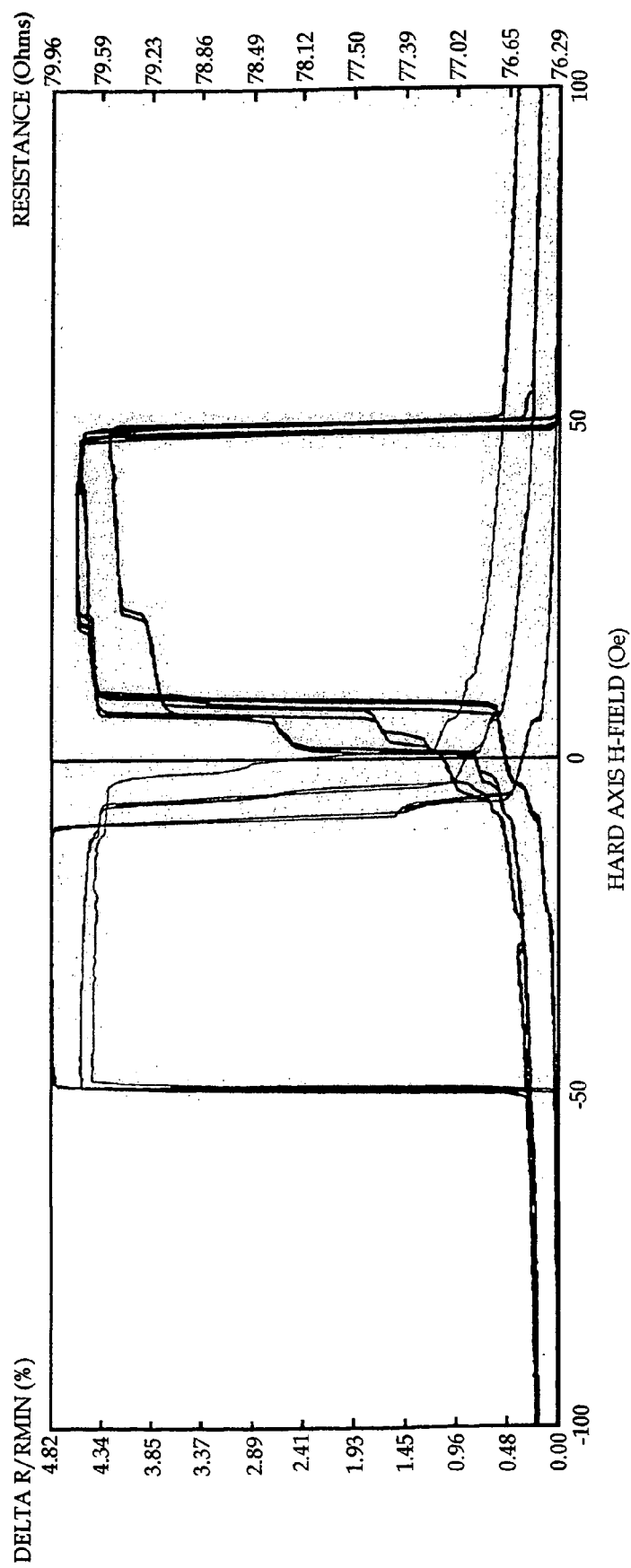
FIG. 8 is an R-H plot of an ASPSV illustrating thresholds for writing data when the ASPSV is selected.

FIG. 8 is an R-H plot of the example of the magnetoresistive stack 400 described earlier in connection with FIGS. 4, 6, and 7. The R-H plot of FIG. 8 illustrates the resistance of the magnetoresistive stack 400 versus the first H-field. However the magnetoresistive stack 400 is also exposed to another H-field, termed a third H-field. The third H-field is generated by passing a current flowing through a select line, such as a word line or a bit line, that is used to select the ASPSV cell that corresponds to the magnetoresistive stack 400. This allows an individual ASPSV cell to be selected from an array of ASPSV cells in an MRAM. With the current flowing through the select line, the magnetoresistive stack 400 switches for a write when the magnitude of the first H-field is about 50 Oe. Thus, FIGS. 6 and 8 illustrate that the magnetoresistive stack 400 can store data when selected with a first H-field strength of only about 50 Oe, and yet retain the data when not selected until the first H-field strength reaches about 75–80 Oe, thereby providing margin for the safe writing of data.

Figure 9:
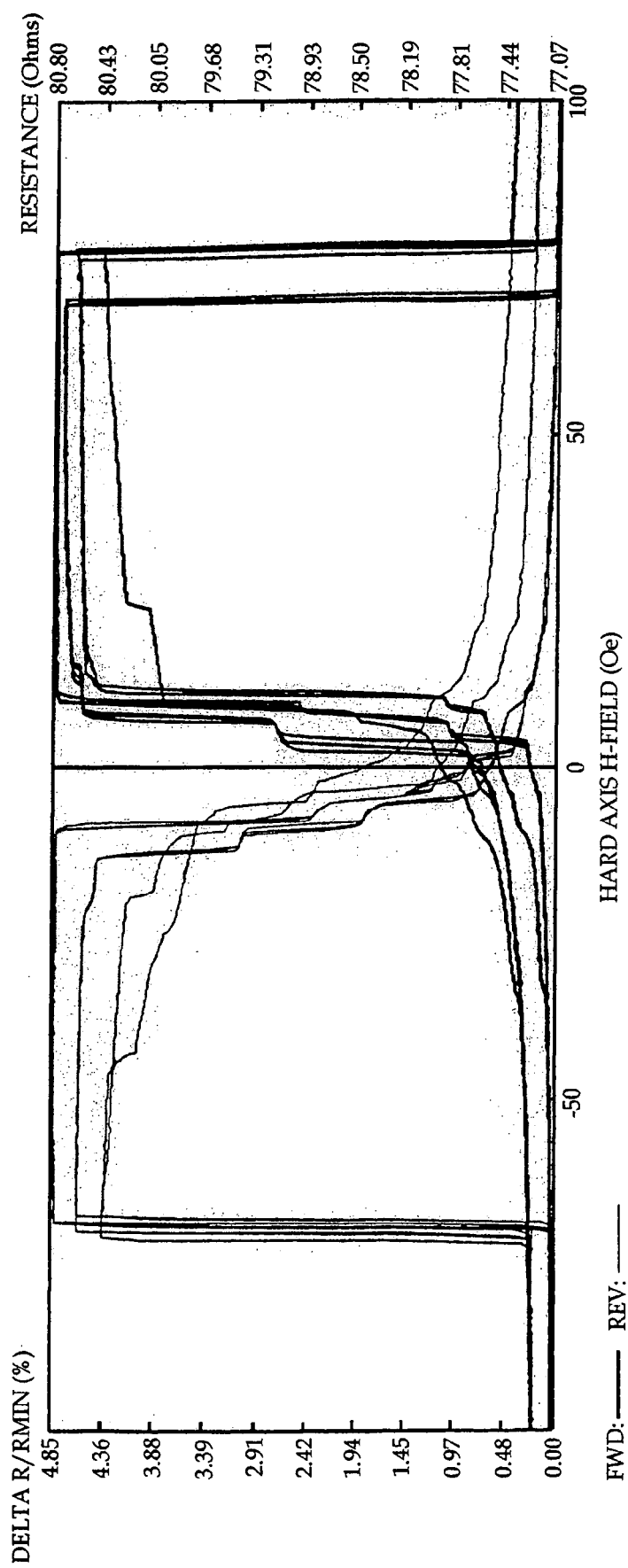
FIG. 9 is an R-H plot of an ASPSV illustrating thresholds for reading data when the ASPSV is not selected.

FIG. 9 is an R-H plot of the example of the magnetoresistive stack 400 described earlier in connection with FIGS. 4, 6, 7, and 8. The R-H plot of FIG. 9 illustrates the resistance of the magnetoresistive stack 400 versus an H-field that is swept along one axis of the magnetoresistive stack 400. In FIG. 9, no other H field is applied to the magnetoresistive stack 400, so that the data plotted in FIG. 9 illustrates the magnitude of H-field that permits a read from the magnetoresistive stack 400 when the magnetoresistive stack 400 is not selected, i.e., not subject to the H-field of an activated select line, such as a bit line or a word line that is carrying current. In the example shown in FIG. 9, the magnetoresistive stack 400 tolerates an H-field of a relatively high magnitude of about 70 Oe before the magnetoresistive stack 400 destabilizes and changes resistance. The change of resistance is undesirable at relatively low H-field strengths because an ASPSV cell that has not been selected should not change resistance. An unintended change in resistance can disadvantageously corrupt the reading of the resistance of the intended or selected ASPSV cell.

Figure 10:
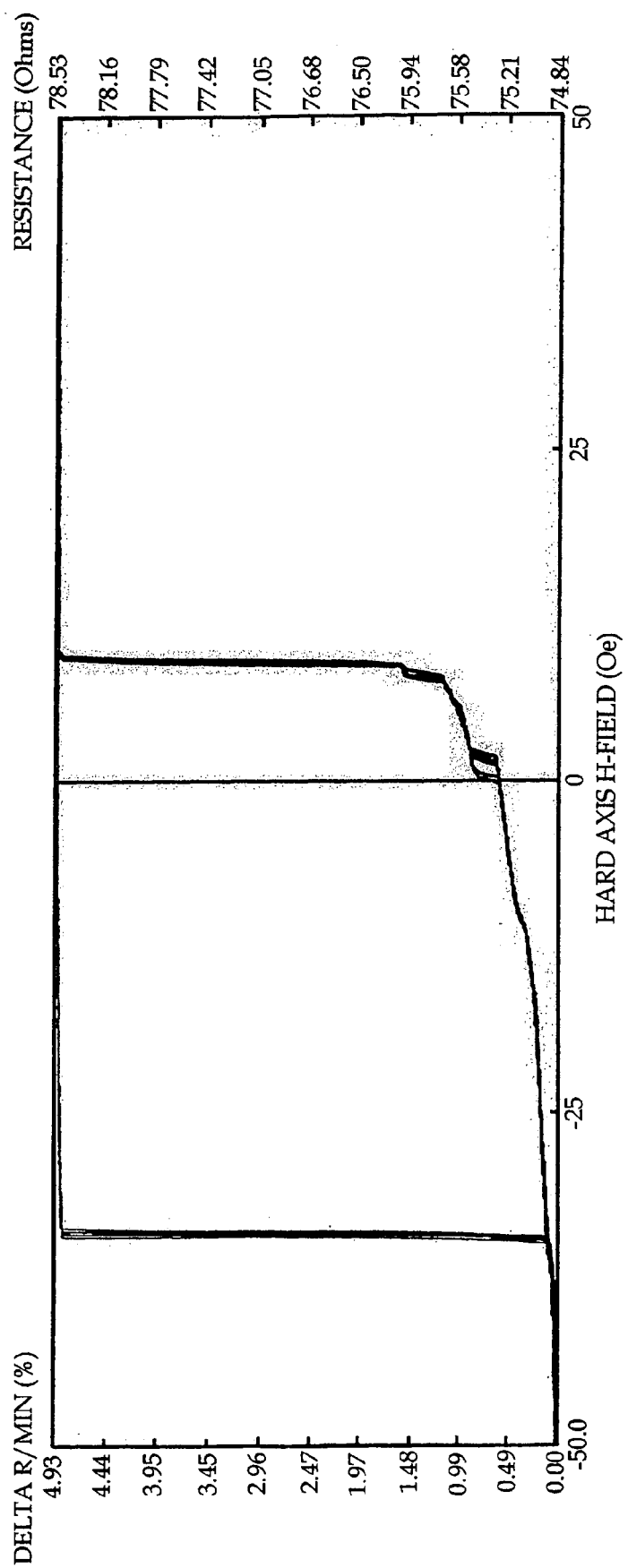
FIG. 10 is an R-H plot of an ASPSV illustrating thresholds for reading data when the ASPSV is selected.

FIG. 10 is an R-H plot of the example of the magnetoresistive stack 400 described earlier in connection with FIGS. 4, 6, 7, 8, and 9. The R-H plot of FIG. 10 illustrates the resistance of the magnetoresistive stack 400 versus an H-field that is swept along one axis of the magnetoresistive stack 400. Another H-field generated from a select line that is carrying a current, such as a word current or a bit current in a word line or in a sense line, respectively, is also applied to the magnetoresistive stack 400. It will be apparent that the scale of the x-axis of the R-H plot of FIG. 10 varies from the R-H plots described in connection with FIGS. 6, 7, 8, and 9.

The magnetic orientation of the soft layer 412 of the magnetoresistive stack 400 is switched or flipped in both directions, and the difference in resistance is interrogated to read the value of the data stored in the magnetoresistive stack 400. The R-H plot of FIG. 10 illustrates that the soft layer 412 of the magnetoresistive stack 400 can be switched or flipped for a read at an advantageously low H-field strength of about 35 Oe. The H-field read separation between the magnetoresistive stack 400 when it has been selected and the magnetoresistive stack 400 when it has not been selected is about 35 Oe. This advantageously allows a corresponding MRAM to use a relatively broad range of H-field strengths to read from individual cells without risking the corruption of data during the read.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

We claim:

1. A digital system comprising:
a magnetic random access memory (MRAM) configured to store data in antiferromagnetically stabilized pseudo spin valves (ASPSVs), where an ASPSV further comprises:
a hard layer of ferromagnetic material, where the hard layer is adapted to store data in a magnetic orientation;
a spacer layer of non-ferromagnetic material disposed adjacent the hard layer;
a soft layer of ferromagnetic material disposed adjacent the spacer layer such that the spacer layer is between the hard layer and the soft layer, where the soft layer is adapted to switch magnetic orientation to allow data to be read from the hard layer;
an antiferromagnetic layer disposed on a side of the soft layer that is opposite to the spacer layer; and
an AFM interlayer disposed between the soft layer and the antiferromagnetic layer, where the AFM interlayer is not formed from an antiferromagnetic material.

2. The digital system as defined in claim 1, wherein the AFM interlayer is about 1 Å to about 5 Å in thickness.

3. The digital system as defined in claim 1, wherein the AFM interlayer is about a monolayer in thickness.

4. The digital system as defined in claim 1, wherein the AFM interlayer is less than a monolayer in thickness.

5. The digital system as defined in claim 1, wherein the antiferromagnetic layer comprises an alloy of manganese.

6. The digital system as defined in claim 1, wherein the antiferromagnetic layer comprises at least one of nickel oxide (NiO) and nickel cobalt oxide (NiCoO).

7. The digital system as defined in claim 1, wherein the AFM interlayer comprises iridium (Ir).

8. The digital system as defined in claim 1, wherein the AFM interlayer comprises at least one of copper (Cu), ruthenium (Ru), chromium (Cr), and aluminum (Al).

9. The digital system as defined in claim 1, wherein the spacer layer is in direct contact with the hard layer, where the soft layer is in direct contact with the spacer layer, where the AFM interlayer is in direct contact with the soft layer, and where the antiferromagnetic layer is in direct contact with the AFM interlayer.

* * * * *